United States Patent
Spreiter et al.

(10) Patent No.: US 7,400,223 B2
(45) Date of Patent: Jul. 15, 2008

(54) SUPERCONDUCTING MAGNET CONFIGURATION WITH RESISTIVE ELEMENTS

(75) Inventors: Rolf Spreiter, Zurich (CH); Robert Schauwecker, Zurich (CH); Pierre-Alain Bovier, Zurich (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/504,714

(22) Filed: Aug. 16, 2006

(65) Prior Publication Data

US 2007/0152787 A1 Jul. 5, 2007

(30) Foreign Application Priority Data

Aug. 25, 2005 (DE) .................. 10 2005 040 374

(51) Int. Cl.
*H01F 1/00* (2006.01)
*H01F 6/00* (2006.01)
*H01F 7/00* (2006.01)

(52) U.S. Cl. .................. 335/216; 335/226; 335/246; 335/296; 361/19; 361/141

(58) Field of Classification Search .................. 335/216, 335/217, 209, 214, 226, 246, 296; 361/19, 361/141
See application file for complete search history.

(56) References Cited

U.S. PATENT DOCUMENTS

| | | | |
|---|---|---|---|
| 3,502,946 A | | 3/1970 | Kimura |
| 4,271,443 A | * | 6/1981 | Nother .................. 361/19 |
| 4,926,289 A | | 5/1990 | Reichert |
| 5,278,380 A | * | 1/1994 | Lowry .................. 219/635 |
| 5,361,055 A | * | 11/1994 | Peck .................. 335/216 |
| 5,426,366 A | | 6/1995 | Overweg |
| 5,532,638 A | * | 7/1996 | Kubo et al. .................. 327/368 |
| 5,627,709 A | * | 5/1997 | Salasoo .................. 361/19 |
| 5,642,249 A | * | 6/1997 | Kuznetsov .................. 361/58 |
| 5,644,233 A | * | 7/1997 | Bird et al. .................. 324/318 |

(Continued)

FOREIGN PATENT DOCUMENTS

DE   102 41 966   4/2003

(Continued)

*Primary Examiner*—Elvin G Enad
*Assistant Examiner*—Mohamad A Musleh
(74) *Attorney, Agent, or Firm*—Paul Vincent

(57) ABSTRACT

A magnet configuration comprising a superconducting magnet coil system (M) and a current path (P) which comprises parts of the magnet coil system (M), wherein at least two electric connecting points (A1, A2, A3, A4) are disposed on the current path (P), which define a section ($P_{A1-A2}$, $P_{A2-A3}$, $P_{A3-A4}$) within the current path (P), wherein the section ($P_{A1-A2}$, $P_{A2-A3}$, $P_{A3-A4}$) does not comprise all parts of the magnet coil system (M) contained in the current path (P), and comprising a resistive element ($W_{A1-A2}$, $W_{A2-A3}$, $W_{A3-A4}$) having an electric resistance value $\geq 0$, and at least two contacts (K1, K2, K3, K4), wherein the contacts (K1, K2, K3, K4) are disposed between the resistive element ($W_{A1-A2}$, $W_{A2-A3}$, $W_{A3-A4}$) and one connecting point (A1, A2, A3, A4), is characterized in that in the superconducting state of the magnet coil system (M), an electric contact (K1, K2, K3, K4) between an electric connecting point (A1, A2, A3, A4) and a resistive element ($W_{A1-A2}$, $W_{A2-A3}$, $W_{A3-A4}$) can be closed and opened. The inventive magnet configuration provides quench protection and also effective disturbance compensation.

14 Claims, 6 Drawing Sheets

U.S. PATENT DOCUMENTS

| | | | |
|---|---|---|---|
| 5,650,903 A * | 7/1997 | Gross et al. | 361/19 |
| 5,731,939 A * | 3/1998 | Gross et al. | 361/19 |
| 5,739,997 A * | 4/1998 | Gross | 361/19 |
| 6,147,844 A * | 11/2000 | Huang et al. | 361/19 |
| 6,265,960 B1 * | 7/2001 | Schauwecker et al. | 335/301 |
| 6,307,370 B1 | 10/2001 | Schauwecker | |
| 6,369,464 B1 | 4/2002 | Schauwecker | |
| 6,563,316 B2 * | 5/2003 | Schauwecker et al. | 324/318 |
| 6,735,848 B1 * | 5/2004 | Markiewicz et al. | 29/599 |
| 6,777,938 B2 | 8/2004 | Schlenga | |
| 6,781,494 B2 * | 8/2004 | Schauwecker et al. | 335/299 |
| 6,816,046 B1 * | 11/2004 | Varney | 335/216 |
| 6,960,914 B2 * | 11/2005 | Shen et al. | 324/319 |
| 7,015,779 B2 * | 3/2006 | Markiewicz et al. | 335/299 |
| 7,098,663 B1 * | 8/2006 | Hollis | 324/320 |
| 7,116,535 B2 * | 10/2006 | Huang | 361/19 |
| 2002/0101239 A1 * | 8/2002 | Schauwecker et al. | 324/318 |
| 2002/0171520 A1 | 11/2002 | Yoshikawa | |
| 2003/0057942 A1 | 3/2003 | Biltcliffe | |
| 2003/0094951 A1 * | 5/2003 | Schlenga et al. | 324/322 |
| 2006/0061361 A1 * | 3/2006 | Westphal | 324/318 |
| 2006/0066429 A1 * | 3/2006 | Kasten | 335/296 |

FOREIGN PATENT DOCUMENTS

| | | |
|---|---|---|
| JP | 5 912 902 | 7/1984 |
| JP | 60 189 206 | 9/1985 |
| JP | 2000 077226 | 3/2000 |

\* cited by examiner

SUPERCONDUCTING MAGNET CONFIGURATION WITH RESISTIVE ELEMENTS

This application claims Paris Convention priority of DE 10 2005 040 374.3 filed Aug. 25, 2005 the complete disclosure of which is hereby incorporated by reference.

BACKGROUND OF THE INVENTION

The invention concerns a magnet configuration with a superconducting magnet coil system and a current path which is at least partially superconducting and comprises at least parts of the magnet coil system, wherein at least two electric connecting points are provided on the current path, which define at least one section within the current path, wherein the section does not comprise all parts of the magnet coil system contained in the current path, and at least one resistive element with a resistance of $\geq 0$ Ohm, and at least two electric contacts, wherein the electric contacts are disposed between the resistive element and one of the at least two electric connecting points.

A magnet configuration of this type comprising a magnet coil system that is divided into several sections is disclosed e.g. in U.S. Pat. Nos. 6,307,370, 6,369,464 and 6,777,938.

Superconducting magnet coil systems are usually configured from several partial-coils. Partial coils, to carry the same electric current during operation, are typically connected in series and form one single superconducting current path. This is advantageous in that the partial coils can be charged and discharged simultaneously using one single current source, with no undesired current differences developing between the partial coils during charging and discharging of the magnet coil system, such that the currents need not be matched during operation.

It is sometimes however, advantageous to eliminate the series connection of the partial coils by providing branchings at certain points in the current path using an electric switching element, which is connected in parallel. The configuration of U.S. Pat. No. 6,307,370 represents a first example of a magnet coil system with branchings in the superconducting current path. The superconducting current path of this configuration is divided into sections, which are bridged via protective resistors. If the superconductivity in a partial coil suddenly fails (quench), the operating current can be discharged from this section via the protective resistor. This prevents the coil from being damaged by high electric voltages or excessive heating.

A change in the surrounding magnetic field, in which the magnet configuration is embedded, is another situation in which it is advantageous for the current path of the magnet coil system to have branchings. Due to the principle of magnetic flux conservation, a current is thereby induced in the superconducting coils of the magnet configuration, which generates a counter field for changes in the surrounding field. When all partial coils are combined into one single current path, individual partial coils may impede each other during compensation of the field disturbance or the disturbance may be overcompensated. Compensation of a disturbance in the surrounding field is achieved when the individual partial coils of the magnet configuration can react to the disturbance with an individually varying current change. This is realized e.g. in a configuration according to U.S. Pat. No. 6,369,464, wherein a section of the superconducting current path of the magnet coil system is bridged and short-circuited by a superconducting switch.

The subject matter of U.S. Pat. No. 6,307,370 is also based on the improvement of the capability of the magnet coil configuration to compensate for field disturbances. Apart from its primary function as quench protection elements, the protective resistors are thereby disposed and designed in such a manner that they allow induction of different compensation currents in different partial coils when the surrounding field changes. This prevents mutual impairment of individual partial coils during compensation of the field disturbance as well as overcompensation of the disturbance. In contrast to U.S. Pat. No. 6,369,464 the differences in the compensation currents, which flow through the protective resistors, decay with time.

In addition to quench protection and disturbance compensation, there is another situation in which branchings in the superconducting current path of the magnet coil system are advantageous. This case is described in U.S. Pat. No. 6,777,938. The superconducting current path thereby comprises a resistive faulty location which results in a magnetic field drift if the operating current is not supported by a current source. This problem is solved in that a non-resistive section of the current path is superconductingly short-circuited and has an inductive coupling with the resistive section. While the slightly resistive section is slowly discharged, the superconductingly short-circuited section is continuously inductively charged. This can maintain the overall field of the configuration at a constant value (drift compensation).

One problem with using branchings in the superconducting current path of a magnet coil system is that, during charging and discharging of the magnet coil system, currents flow through the electric components in contact with the branchings. When the resistance values of these elements are small, it may take a very long time until the currents in the coil sections are balanced at the end of the charging process. Moreover, the components that are connected in parallel at the coil sections are heated. This is critical when the components are located in the cooling container of the magnet system. Since superconducting magnet coil systems must be cooled down to very low temperatures of typically a few Kelvin, discharging of additional heat is very expensive.

For this reason, the resistance values of protective resistors, which are permanently connected to the superconducting current path, must be sufficiently high. If the resistance values are too high, the protective resistors can no longer provide ideal protection in case of a quench. Resistance values of the order of magnitude of one Ohm are usually a good compromise for dimensioning protective resistors.

When a partial section of the superconducting current path is to be short-circuited for compensating a magnetic drift or magnetic disturbances, resistance values on the order of magnitude of one ohm are too large. For such applications, the short-circuit is ideally in the extremely low-ohmic or superconducting range. These short-circuits are usually designed as a superconducting switch instead of a low-ohmic resistive element or a superconducting connection. By heating the superconducting wire of this switch is brought into a resistive state during charging and discharging of the magnet configuration, such that a high-ohmic connection is produced between the connecting points of the superconducting switch instead of a superconducting short-circuit. This partially prevents branching of current from the superconducting current path of the magnet coil system during charging and discharging. However, heating of the superconducting switch introduces heat into the cooling container of the magnet configuration that causes undesired loss of coolant.

In contrast thereto, it is the underlying purpose of the present invention to provide branchings for the current in the superconducting current path in the superconducting operating state of a magnet configuration with a superconducting magnet coil system and a superconducting current path, which comprises at least parts of the superconducting magnet coil system, at the same time preventing branching of the currents from the superconducting current path during charging and discharging of the magnet configuration.

SUMMARY OF THE INVENTION

This object is achieved in accordance with the invention in that, in the superconducting state of the magnet coil system, at least one electric contact between at least one electric connecting point and at least one resistive element can be opened and closed.

When the contact is closed, the resistive elements are connected in parallel with the sections of the superconducting current path, which are defined by the electric connecting points. The inventive configuration is advantageous in that electric components which bridge sections of the superconducting current path of the magnet coil configuration are in contact with the superconducting current path via their connecting points only when their function is useful but not when their presence could have a disadvantageous effect e.g. on the charging and discharging process of the magnet. The sections can be freely divided and the resistance values of the bridged components can be freely dimensioned. In particular, components with very low ohmic values may be used without superconducting switches, which is not possible with components, which are in fixed contact with the superconducting current path of the magnet coil system. In total, the function of the bridged components can be improved (for compensating magnetic field disturbances, drift compensation, coil protection in case of a quench) and the time required to obtain balanced currents in the coil sections after charging and discharging and the heat input in the cooling container during charging and discharging can be eliminated.

One inventive magnet configuration is particularly advantageous, wherein the superconducting magnet coil system generates a magnetic field in the direction of a z axis in a working volume disposed about z=0 on the z axis during operation, and wherein the connecting points are disposed within the current path of the magnet coil system in such a manner that the value $$\beta(t) = 1 + \frac{b \cdot \Delta I(t)}{\Delta B_z}$$

with at least two closed contacts between the connecting points on the current path and resistive elements having a resistance value of $\geq 0$, results in a value $\beta_{closed}(t=0)$ at a time t=0, whose amount is smaller than the value $\beta_{open}(t=0)$ which results at a time t=0 with open contacts, wherein b: is the vector of the magnetic fields in the direction of the z-axis of each winding of the magnet coil system in the working volume for a current of 1 ampere, $\Delta I(t)$: is the vector of the current changes of each winding of the magnet coil system which are induced by a change $\Delta B_z$ of the magnetic field, wherein $\Delta B_z$ is the component parallel to the z axis of a step change of the magnetic background field in the region of the magnet configuration at a time t=0.

The value $\beta$ corresponds to the portion of a change of the surrounding field, which can be detected in the working volume of the magnet configuration. When $\beta=1$, the field compensation penetrates into the working volume without compensation. $\beta=0$ means complete compensation of the disturbance and $\beta<0$ corresponds to overcompensation of the disturbance by the magnet coil system, i.e. the vector of the field change in the working volume faces in a direction opposite to that of the vector of the change of the surrounding field.

Individual partial coils may impair each other during compensation of the field disturbance within a superconducting current path in which several partial coils of a magnet coil system are connected in series, or the disturbance may be overcompensated, i.e. $|\beta|$ is substantially larger than zero. This may be prevented by separating the superconducting current path into several sections during operation of the configuration, which are bridged with resistive elements, wherein individually different compensation currents can be induced in case of a field disturbance. By increasing the number of sections, the degree of freedom of the compensation currents is increased which typically improves the results of disturbance compensation, i.e. $|\beta_{closed}(t=0)|<|\beta_{open}(t=0)|$. Fine division of the current path into resistively bridged sections causes problems during charging and discharging of the magnet configuration. For this reason, it is particularly advantageous that the contacts between the connecting points which define the sections of the superconducting current path, and the resistive elements can be opened and closed in the superconducting state of the magnet configuration. In this embodiment of the inventive magnet configuration, closing contacts can activate a circuit, which optimizes the capacity of the magnet configuration to compensate for disturbances in the surrounding field.

In order to characterize the behavior of a magnet configuration in case of disturbances in the surrounding field, we advantageously assume a step disturbance with a field jump at a time t=0. The division of the superconducting current path of the magnet coil system into sections which are individually short-circuited with resistors influences the compensation behavior at the time t=0 of the magnet configuration. The size of the resistive elements influences the compensation behavior for times t>0. When all resistive elements have a resistance value of 0 (superconducting short-circuits), the individually different compensation currents which are induced in the sections are permanently maintained for all times and $\beta_{closed}(t)=\beta_{closed}(t=0)$ for all t. When all contacts are open, $\beta_{open}(t)=\beta_{open}(t=0)=\beta_{open}$ for all t. When the resistance values of the resistive elements are larger than 0, the individually different compensation currents induced in the sections will decompose with time and the following applies:

$\beta_{closed}(t) \rightarrow \beta_{open}$ for $t \rightarrow \infty$.

If, due to a suitable subdivision of the superconducting current path of the magnet coil system, $|\beta_{closed}(t=0)|<|\beta_{open}|$, it is advantageous if the time period in which $\beta_{closed}(t)$ approaches the final value $\beta_{open}$ is as long as possible. In this case, the magnetic disturbance is immediately well compensated for and then, penetrates only slowly into the working volume of the magnet configuration with a large attenuation over time. Moreover, if possible $\beta_{closed}(t)$ should approach the final value $\beta_{open}$ monotonically, i.e. without any overswinging. For this reason, in a particularly advantageous embodiment of the invention, the resistive elements, which bridge the sections, are dimensioned such that in case of at least two closed contacts between the resistive elements and the connecting points which define sections of the superconducting current path of the magnet coil system, the magnitude of the value $\beta_{closed}(t)$ is smaller or equal to the value $\beta_{open}(t)$ for all times t, which results from open contacts (K1, K2, K3, K4). This is typically achieved by selecting minimum resistance values, preferably in the range of milliohms.

In order to minimize the resistance values, the resistive elements may be cooled. In one particularly advantageous embodiment of the inventive magnet configuration, the resistive elements are disposed together with the superconducting magnet coil system in a cooled chamber.

If resistive elements which can be contacted, e.g. for compensating disturbances of the magnetic field surroundings are used, protection of the magnet coil system in case of a quench using additional, permanently wired protective elements can be ensured. For this reason, at least one permanently wired protective element advantageously bridges parts of the current path in parallel.

Preferably, at least one of the permanently wired protective elements comprises ohmic resistive elements or diodes or a combination of both. Diodes are advantageous in that no heat is generated during charging and discharging of the magnet system, thereby keeping the coolant consumption at a low level.

Permanently wired protective elements must have a sufficiently large resistance to prevent problems during charging and discharging of the magnet configuration. In case of disturbance of the magnetic field surroundings, each coil section bridged with protective resistors can react with an individually different induced current change, however, the differences between the induced currents quickly decompose via the protective resistors, and the disturbance enters the working volume of the magnet configuration with only little delay. For this reason, additional low-ohmic resistive elements are advantageously contacted via sections of the superconducting current path of the magnet coil system for attenuating disturbances of the magnetic field surroundings. In a preferred embodiment of the invention, the resistive elements have a resistance value which is smaller than the resistance value of the protective elements.

In a further advantageous embodiment of the inventive magnet configuration, the resistive elements are part of a plug, and the resistive elements can be connected to the connecting points through closing the contacts by inserting the plug into its counter pole, from which the connecting points extend. Depending on the operating state, the additional resistive elements can thereby be connected or disconnected in a simple fashion. This type of contact facilitates exchange of the resistive elements, thereby experimentally optimizing e.g. the capacity of the magnet configuration to compensate for disturbances in the surrounding field during operation. Moreover, in case of damage to the additional resistive elements during a quench of the magnet coil system, the resistive elements can be quickly replaced.

It is thereby also feasible to connect the resistive elements to the connecting points on the superconducting current path through closing the contacts by operating a switch.

In a preferred embodiment, the resistance value of the resistive elements increases with increasing current.

In case of a quench of the superconducting magnet coil system, the resistive elements advantageously assume a high-ohmic value, in particular, a resistance value of more than 10 ohms. In this case, the permanently wired protective elements ensure protection of the magnet coil system, when these protective elements have a smaller resistance value, and therefore are able to carry the current from the quenched sections instead of the additionally switched high-ohmic resistive elements. During operation, the resistive elements have low ohmic values and cause good temporal attenuation of entering disturbances in the field surroundings in the working volume of the magnet configuration. In case of a quench, the resistive elements assume a high ohmic value, wherein these elements, the connecting points on the superconducting current path, the wires and contacts are protected from high currents in case of a quench.

The resistive elements are preferably safety elements that can carry at most 20% of the magnetic current before they burn-through and assume a high ohmic value, assuming a resistance value of more than 10 ohms. Safety means which melt at a particular current and which are used as resistance values which can be additionally connected, optimally meet the requirements for optimum compensation of disturbances of the field surroundings of the magnet configuration. During operation, the resistive elements have very low ohmic values. During a quench they melt and quickly assume a high ohmic value. This protects the connecting points on the superconducting current path, the wires and the contacts from high currents.

The invention also concerns a method for operating an inventive magnet configuration, in which at least one of the electric contacts between at least one electric connecting point on the superconducting current path of the magnet coil system and at least one resistive element is closed during operation of the magnet coil system and is opened during charging and discharging of the magnet coil system. During operation, the connectable resistive elements, which typically have a very low ohmic value, ensure that the effect of disturbances in the field surroundings of the magnet configuration on the working volume is greatly delayed. During charging and discharging of the magnet configuration, the low-ohmic connections are undesired and their contacts to the superconducting current path are interrupted, since otherwise they would e.g. generate additional heat in the cooling container of the magnet configuration, or they would increase the time period until the currents in the sections of the magnet coil system are balanced after charging. If the resistive elements are safety elements, they could melt during charging/discharging of the magnet configuration, which must be prevented.

This method for operating an inventive magnet configuration involves switching between two different states. One of the states is optimized for charging and discharging the magnet. The other state is optimized e.g. for compensating disturbances in the surrounding field of the magnet configuration. It is also feasible to optimize quench protection of the coil in the second state or compensate for a field drift of the magnet coil configuration.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 1:
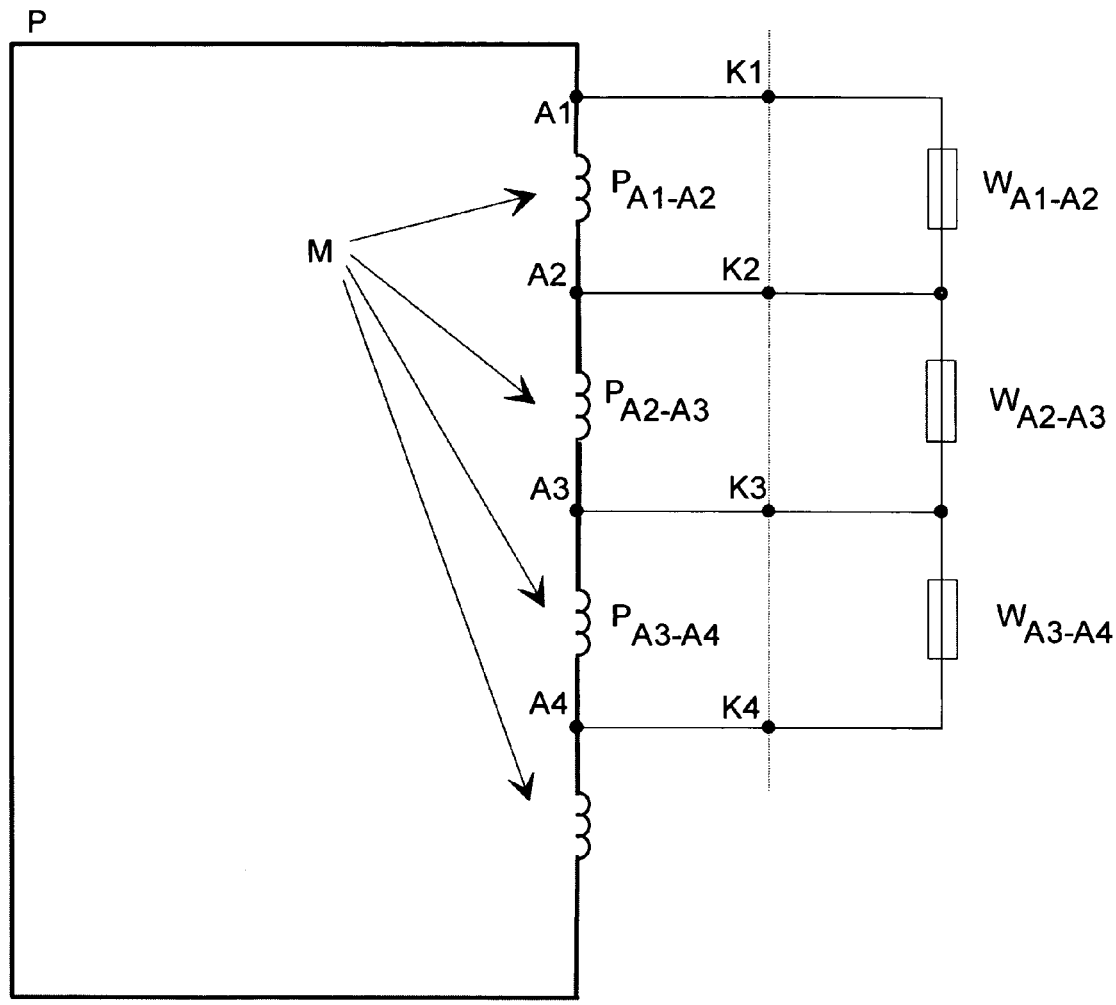
FIG. 1 shows a circuit of an inventive magnet configuration with resistive elements, which can be contacted.

FIG. 1 shows an inventive configuration comprising a magnet coil system M with three sections $P_{A1-A2}$, $P_{A2-A3}$, $P_{A3-A4}$ in the form of partial coils which are defined by connecting points A1, A2, A3, A4 and with a current path P which comprises the sections $P_{A1-A2}$, $P_{A2-A3}$, $P_{A3-A4}$.

The sections $P_{A1-A2}$, $P_{A2-A3}$, $P_{A3-A4}$ can be bridged with resistive elements $W_{A1-A2}$, $W_{A2-A3}$, $W_{A3-A4}$ during operation. Contacts K1, K2, K3, K4 are provided between the resistive elements $W_{A1-A2}$, $W_{A2-A3}$, $W_{A3-A4}$ and the connecting points A1, A2, A3, A4, which can be opened and closed in the superconducting state of the magnet configuration. At least two contacts are therefore connected in series between a respective connecting point A1, A2, A3, and A4 and the associated resistive element $W_{A1-A2}$, $W_{A2-A3}$, $W_{A3-A4}$. When the contacts K1, K2, K3, K4 are closed, the resistive elements $W_{A1-A2}$, $W_{A2-A3}$, $W_{A3-A4}$ are connected in parallel with the sections $P_{A1-A2}$, $P_{A2-A3}$, $P_{A3-A4}$ at the connecting points A1, A2. A3, A4.

Figure 2:
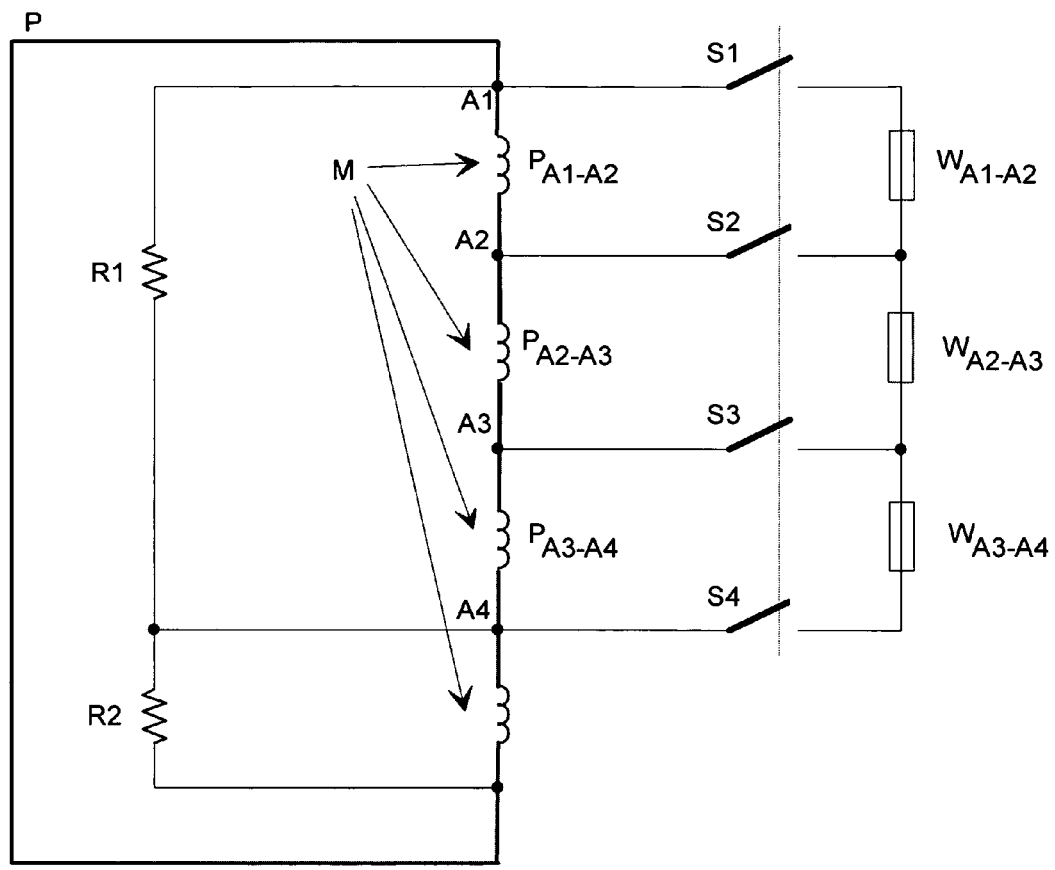
FIG. 2 shows a circuit of an inventive magnet configuration with permanently wired protective elements and connectable resistive elements.

FIG. 2 shows a further embodiment of the inventive configuration, wherein the contacts K1, K2, K3, K4 can be closed and opened through actuating the switches S1, S2, S3, S4. Protective elements R1, R2 are provided as quench protection of the magnet configuration, which are permanently wired to the magnet coil system M.

Figure 3:
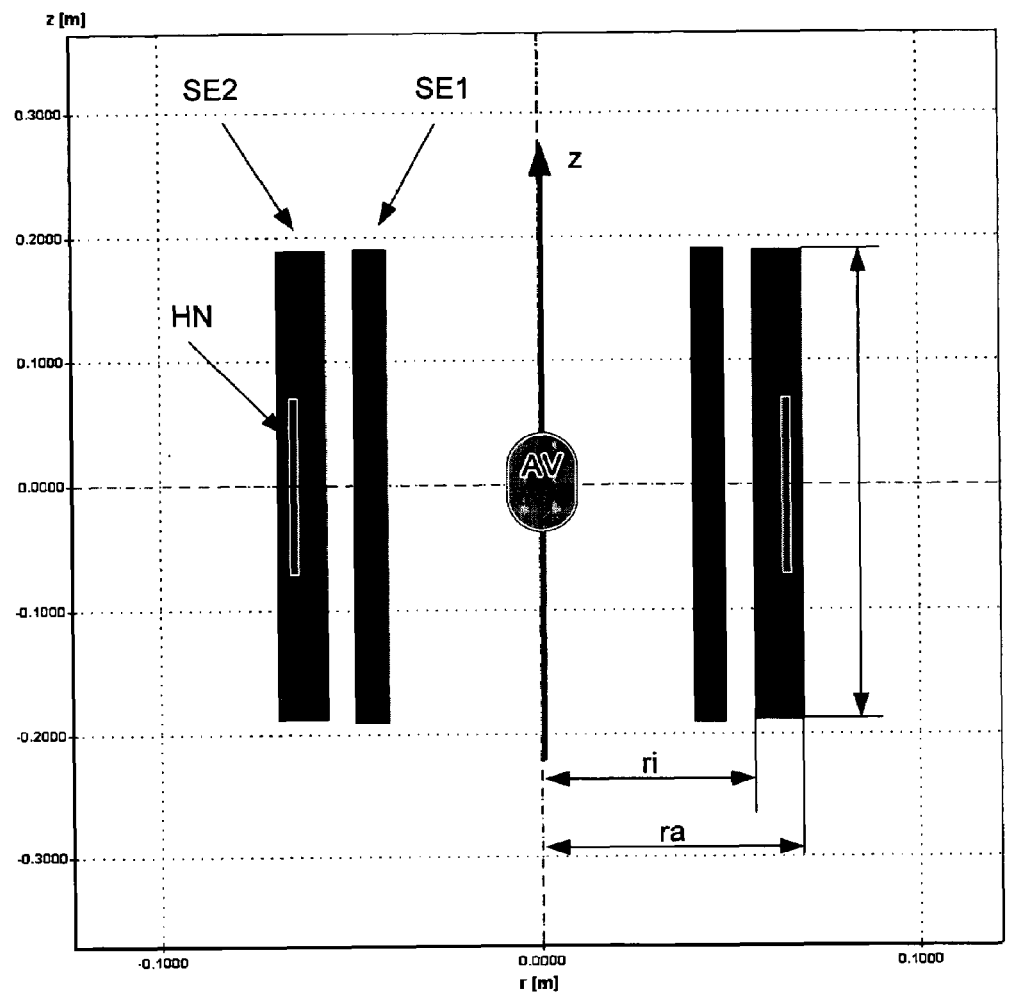
FIG. 3 shows a schematic illustration of a superconducting magnet coil system with a working volume.

FIG. 3 shows a schematic sectional view of an embodiment of an inventive superconducting coil configuration. Two sections SE1 and SE2 of the magnet coil system M which may be solenoid coils of a length l are disposed concentrically to each other at a separation ri or ra from the axis of symmetry z of the magnet configuration. A working volume AV is located in the magnetic center, where the z component of the magnetic field is maximum and where the sample to be investigated may be placed. The outer section SE2 contains a region with half the current density, a so-called half notch HN, which is designed to homogenize the magnetic field in the working volume AV.

Figure 4:
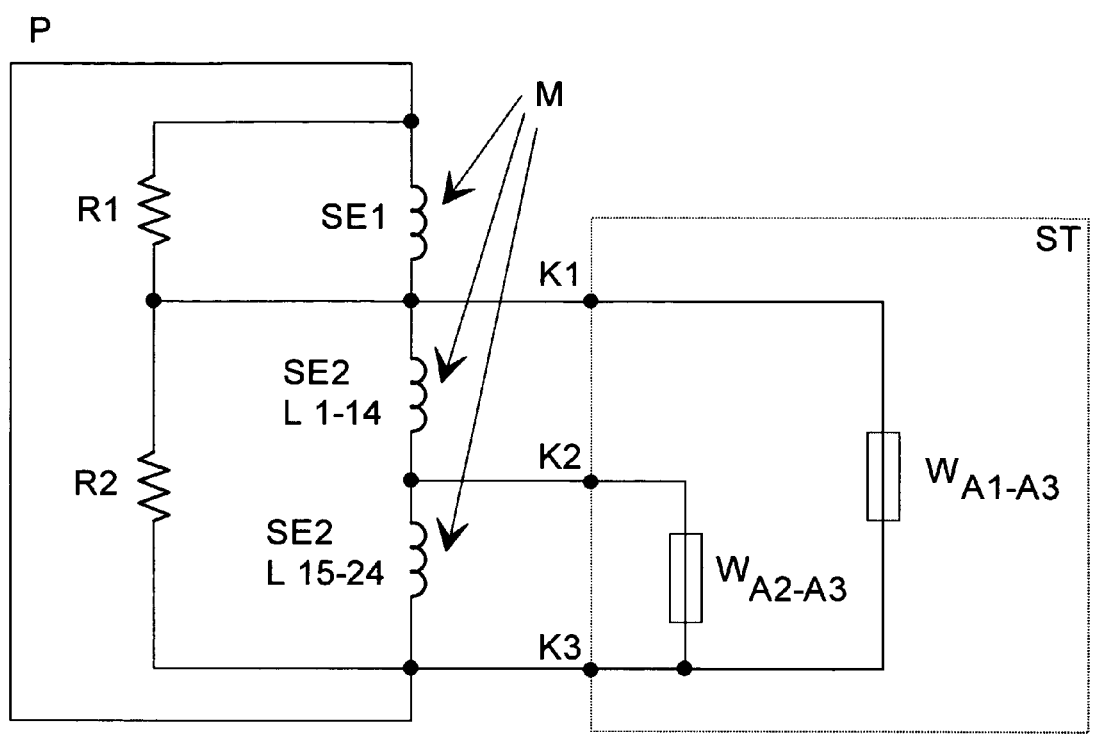
FIG. 4 shows a circuit of an inventive magnet configuration with two resistive elements which can be inserted.

FIG. 4 shows a further embodiment of an inventive magnet configuration, wherein coil sections SE2L1-14, SE2L15-24 of the outer section SE2 of the magnet coil system M of FIG. 3 can be bridged with two resistive elements $W_{A1-A3}$, $W_{A2-A3}$. The resistive elements $W_{A1-A3}$, $W_{A2-A3}$ are integrated in a plug ST.

Figure 5:
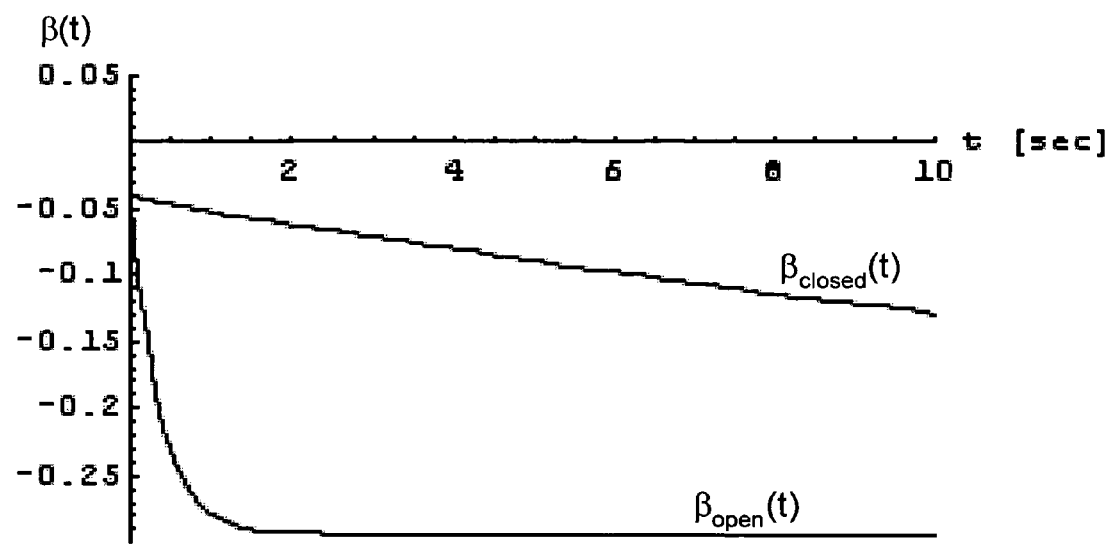
FIG. 5 shows a graphic illustration of a factor $\beta(t)$ which can be obtained with the inventive configuration as a function of time (simulation)
Figure 6:
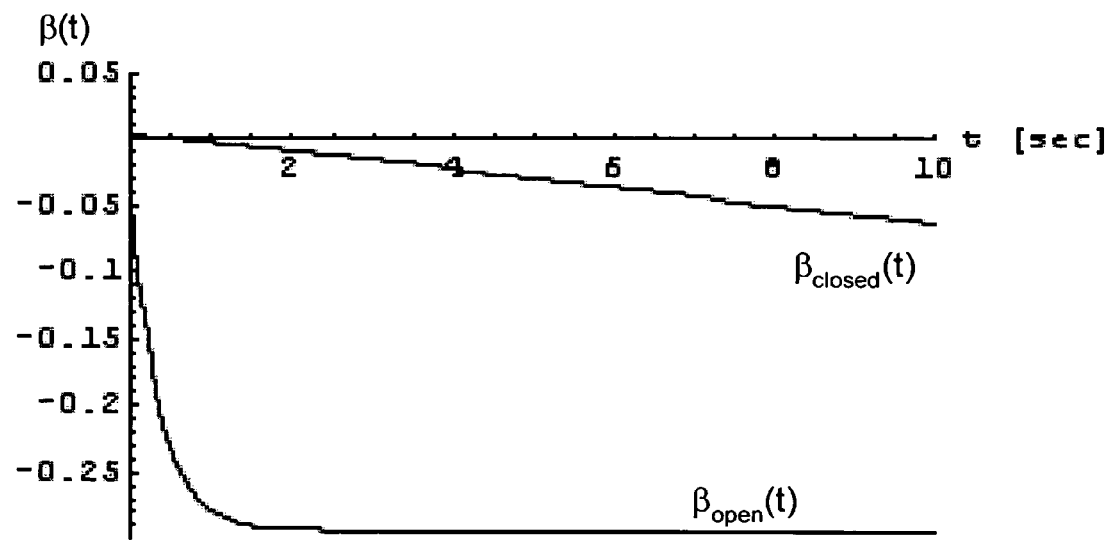
FIG. 6 shows a graphic illustration of a factor β(t) which can be obtained with an inventive configuration and is further reduced compared to FIG. 5 as a function of time (simulation)

FIG. 5 shows the calculated value β(t) of an inventive configuration in accordance with FIGS. 3 and 4, with open contacts K1, K2, K3 ($β_{open}$(t)), and with two closed contacts K1 and K3 ($β_{closed}$(t)). $β_{closed}$(t>0) has a smaller value than $β_{open}$(t>0), but at time t=0 there is no difference FIG. 6 shows the calculated value β(t) of an inventive configuration in accordance with FIGS. 3 and 4, with open contacts K1, K2, K3 ($β_{open}$(t)), and with closed contacts K1, K2, K3 ($β_{closed}$(t)). In this example, at time t=0 $β_{closed}$(t=0) is less than $β_{open}$(t=0).

$|β_{closed}|<|β_{open}|$ means that the capacity of the magnet configuration to attenuate the effects of a disturbance in the magnetic surrounding field on the field in the working volume is improved by closing the contacts.

Figure 7:
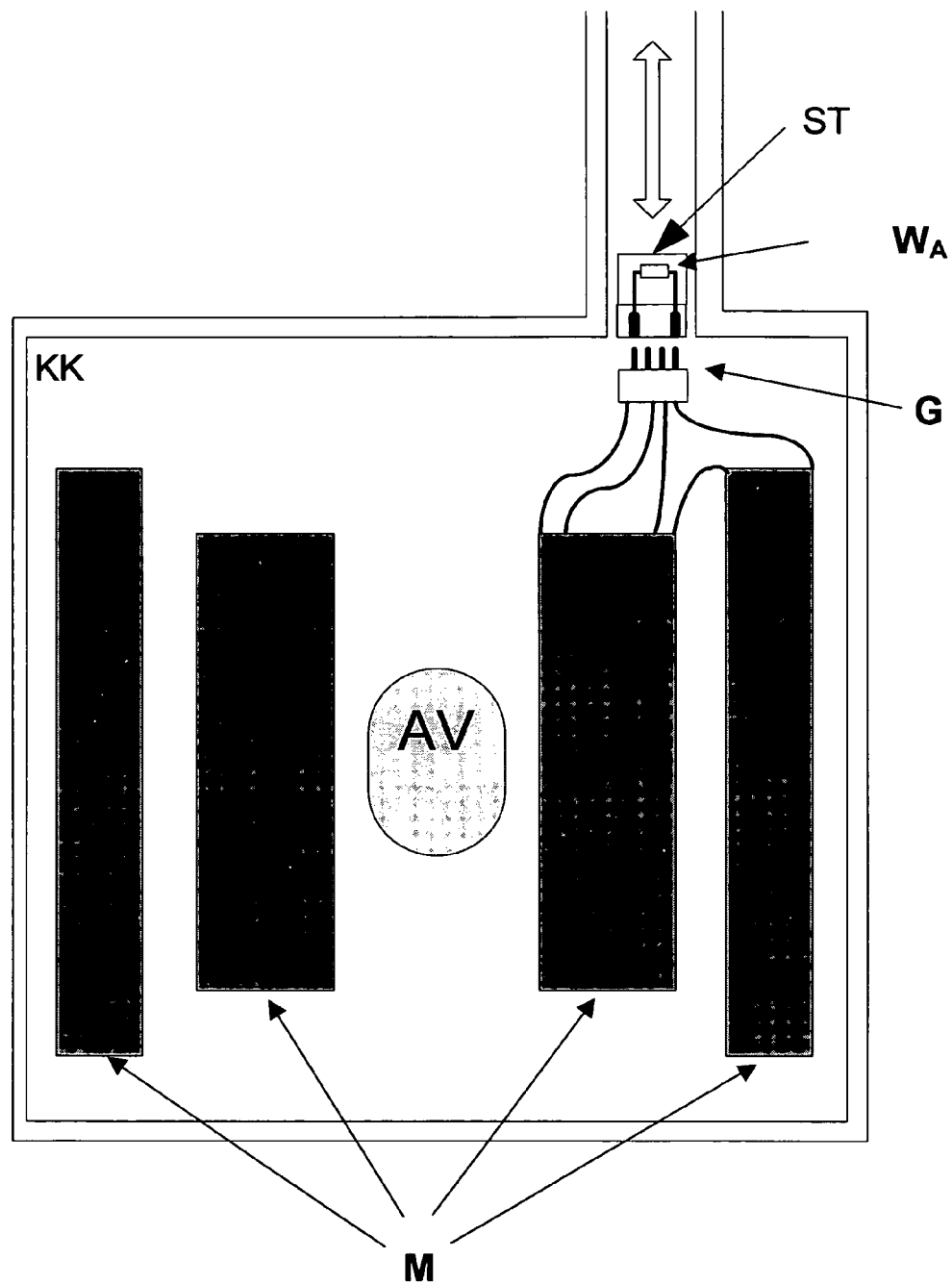
FIG. 7 shows an inventive magnet configuration with a resistive element as part of a plug in a cooling chamber of the magnet coil system.

FIG. 7 shows an inventive configuration of a magnet coil system with a working volume AV, wherein a resistive element $W_A$ is integrated in a plug ST. The plug ST can be connected in the superconducting state of the magnet coil system M through insertion into its counter pole G and be removed again, and is located in the same cryogenic chamber KK as the magnet coil system M.

The invention is explained below with reference to examples. A first example refers to an embodiment of the invention, wherein inventive resistive elements, which can be contacted and have the function of protective resistors, replace permanently wired protective resistances in a magnet configuration. A second example refers to a magnet configuration with drift compensation that can be connected or disconnected in accordance with the invention. The third example shows an inventive device for compensating for disturbances in the magnetic background field of the magnet configuration.

During charging of a superconducting magnet configuration, permanently wired protective resistors, which are connected in parallel with the coil sections, disadvantageously dissipate energy, which produces coolant loss. Protective resistors only have the function to protect the magnet from excessive heating and excessive voltages during a breakdown of the superconduction (quench). As long as the energy stored in the magnet configuration is not large, this protection is not required. If e.g. during charging of the magnet configuration, the resistive elements serving as protective resistors come in contact with the superconducting current path only at 70% of the magnetic current (50% of the energy), the energy dissipated in the resistors can be reduced to 30% which is an enormous advantage with regard to the coolant loss.

The patent application US 2002/0171520 A1 describes a magnet configuration with superconducting additional switches, which are used for drift compensation. The additional active switches 25a and 25c (table 1, page 8) yield particularly efficient drift compensation. We will now show that the use of connectable resistive elements instead of superconducting switches achieves the same result with less effort, however, only for a limited time.

As is stated in the patent application US 2002/0171520 A1, the wiring diagram of FIG. 6 thereof can be used with values L1=1.929 H, L2=2.075 H, L3=185.314 H, M1=1.211 H, M2=13.840 H, M3=7.975 H, R1=4.77*10$^{-13}$ Ω, R2=2.00*10$^{-11}$ Ω, R3=1.94*10$^{-9}$ Ω. The field strengths of the coils are K1=0.0169 T/A, K2=0.0080 T/A and K3=0.0502 T/A in the working volume of the magnet configuration. The drift with additional switches is calculated from formulas (12) and (13) as 0.0015 ppm/h, which is considerably better compared to the specified 0.01 ppm/h. Without additional switch, the drift would be −0.012 ppm/h.

Handling with the additional switches is, however, very demanding, since the magnet must be heated and repaired when a drift has been detected. The additional switches must also be heated during charging of the magnet configuration, which produces additional loss of cryogenic liquid. In contrast thereto, the inventive use of connectable resistive elements is very simple, since e.g. only one plug must be inserted into its counter pole. If, in the above example, the additional switches via L1 and L2 are replaced by short-circuits of 1 mΩ each, one obtains an initial drift of 0.0015 ppm/h and the drift remains better than the specified 0.01 ppm/h for approximately one hour. This configuration is thus suited for applications with measurements at different field strengths for a period of no more than one hour. After setting the target field, the field strength in the working volume can be sufficiently stabilized for the measurement using simple means.

An example is described below which considerably improves the behavior of a magnet configuration in response to fluctuations of the background field by connecting small resistive elements after charging the magnet configuration. The embodiment forming the basis of this example is the inventive configuration of FIGS. 3 and 4.

Although the invention not only concerns magnet systems with a magnetic field being particularly homogeneous in the working field, these are particularly sensitive to fluctuations of the background field. For this reason, an example of such a system is given, wherein the use of connectable resistive elements improves the disturbance behavior. The following table shows the geometry of the coil system.

The designations in table 1 (see FIG. 3):
ri the inner radius of the solenoid coil,
ra the outer radius of the solenoid coil,
l the length of the solenoid coil,
W the number of wire windings on each layer of the solenoid coil,
N the number of wire layers of the solenoid coil.

TABLE 1

|  | Section 1 SE1 | Section 2 SE2 | Half notch HN |
|---|---|---|---|
| ri [Millimeter] | 40.0 | 56.0 | 63.8 |
| ra [Millimeter] | 49.2 | 69.4 | 66.1 |
| l [Millimeter] | 382 | 379 | 141.2 |
| W | 510 | 590 | 220 |
| N | 14 | 24 | 4 |

The half notch HN is a region of half the current density in the section SE2 and renders the field in the center of the coils as homogeneous as possible.

The sections SE1 and SE2 are electrically connected in series and superconductingly short-circuited. A protective element R1 of 1 ohm is permanently connected to the superconducting current path P parallel to section SE1 (FIG. 4), and a protective element R2 of 2 ohms is permanently connected to the superconducting current path P parallel to section SE2.

In order to investigate the behavior of this magnet configuration relative to fluctuations of the background field, a disturbance loop having a diameter of 2 meters is used. This loop is disposed concentrically to the sections SE1, SE2 at the level of the center of the solenoid coil. At time $t=0$ a current of 10 amps is introduced into this loop. The time behavior of the current is assumed to be stepped for reasons of simplicity.

The notation for the essential values of the magnet configuration must be fixed prior to calculation of the temporal development of the currents induced in the superconducting magnet coils of the magnet coil system M:

$$L = \begin{pmatrix} 0.884 & 1.74 \\ 1.74 & 6.18 \end{pmatrix}$$

[Henrey]: Inductance matrix solved according to sections SE1 and SE2, $$I = \begin{pmatrix} I_1 \\ I_2 \end{pmatrix};$$

currents in sections SE1 and SE2, $b=(229\ 417)$[Gauss/A]: field per ampere of the sections SE1 and SE2 in the center of the magnet configuration, $$L_{coupling} = \begin{pmatrix} 27.6 \\ 105 \end{pmatrix}$$

[μHenry]: inductive coupling of the disturbance loop to sections SE1 and SE2,
$\Delta I_{pert}=10$[A]: current change in the disturbance loop,
$b_{pert}=0.00628$[Gauss/A]: field per ampere of the disturbance loop in the center of the magnet configuration,
$\Delta B_z = b_{pert} * \Delta I_{pert} = 0.0628$[Gauss]: change in the background field,
$R_1=1[\Omega]$, $R_2=2[\Omega]$: protective resistors parallel to sections SE1 and SE2.

According to Lenz's law, each section of the magnet configuration in question reacts to the field disturbance at time $t=0$ with its own current change $\Delta I_1$, $\Delta I_2$. These current changes are sufficiently large that the magnetic flux through each section remains unchanged. To be more precise:

$$L\Delta I = -L_{coupling}\Delta I_{pert}$$

or $$\Delta I = -L^{-1} L_{coupling}\Delta I_{pert} = \begin{pmatrix} 49.8 \\ -184 \end{pmatrix} [\mu A].$$

We only consider current changes in sections SE1 and SE2 and for this reason, the currents $I_1$ and $I_2$ for $t<0$ are set to zero, such that the currents at time $t=0$ are $\Delta I_1$, $\Delta I_2$:

$$I(t=0) = \begin{pmatrix} 49.8 \\ -184 \end{pmatrix} [\mu A]$$

If we multiply these currents by the corresponding field strength b of the sections SE1, SE2, we obtain the field contribution of sections SE1, SE2 in the center of the magnet configuration. The overall field change in the center of the magnet configuration is the additive superposition of the contribution of the sections SE1, SE2 and the contribution of the disturbance loop:

$$b \cdot I(t=0) + \Delta B_z = 0.0114 - 0.0767 + 0.0628 = -0.0025$$
[Gauss]

If we consider this field change relative to the fluctuations in the background field $\Delta B_z$, we obtain the dimensionless value $$\beta(t=0) = 1 + \frac{b \cdot I(t=0)}{\Delta B_z} = -0.040$$

Due to the shielding currents in the sections SE1, SE2, only −4% of the background field fluctuations reach the center of the magnet configuration at time $t=0$. The negative sign means that the direction of the field vector of the disturbance in the working volume AV is reversed, i.e. the disturbance is overcompensated for by the magnet coil system M. If we wait for a sufficient time, the differential current between sections SE1 and SE2 decomposes and only one single current flows through both sections SE1, SE2. The value of this current is obtained by replacing all vectors and matrices by the sum of their entries in the above calculation. Designating the new one-dimensional values with a tilde, we obtain the following results:

$$\tilde{I}(t=\infty) = -\tilde{L}^{-1}\tilde{L}_{coupling}\Delta I_{pert} = -10.5^{-1} * 132.6 * 10^{-6} * 10[A] = -126 \ [\mu A]$$

$$\tilde{b} \cdot \tilde{I}(t=\infty) + \Delta B_z = -0.0814 + 0.0628 = -0.0186 \ [Gauss]$$

$$\beta(t=\infty) = 1 + \frac{\tilde{b} \cdot \tilde{I}(t=0)}{\Delta B_z} = 0.30$$

After a long time, approximately −30% of the disturbance enters the center of the magnet configuration. The speed at which the disturbance enters is now particularly decisive for the disturbance behavior of the magnet configuration. For times t>0, the currents follow the system of differential equations $$L\frac{dI}{dt} = -R \cdot I$$

with the resistance matrix $$R = \begin{pmatrix} R_1 - R_1 s_1 & -R_1 s_2 \\ -R_2 s_1 & R_2 - R_2 s_2 \end{pmatrix}$$

wherein $$s_1 = \frac{R_1}{R_1 + R_2},$$

$$s_2 = \frac{R_2}{R_1 + R_2}$$

The solution of the system of differential equations is an exponential function. The characteristic time constant τ is the reciprocal value of the larger eigenvalue of the matrix $$L^{-1}R = \begin{pmatrix} 2.17 & 0.718 \\ -2.17 & -0.718 \end{pmatrix} \ [Hz]$$

while the smaller eigenvalue of the matrix is zero (the two sections are superconductingly short-circuited). One obtains τ=0.35[sec]

The great advantage that the disturbance at time t=0 is well suppressed hardly plays a role, since almost −30% of the background field $\Delta B_z$ has reached the center of the magnet configuration after less than 1 [sec].

The situation improves when the section SE2 is bridged with a resistance $W_{A1-A3}$ of 10 [mΩ]. One obtains the time constant τ=23[sec]

The fluctuation of the background field $\Delta B_z$ can reach the center of the magnet configuration only very slowly (FIG. 5).

For further improvement, the last 10 layers of section SE2 are bridged with a resistance $W_{A2-A3}$ of 10 [mΩ]. The finer division of the magnet coil reduces β(t=0) to 0.2%. The time constant with both resistors is 10 [mΩ] at τ=33[sec] (FIG. 6).

Resistive elements with resistance values on the order of magnitude of milliohms cannot be permanently contacted with the superconducting current path, since this would cause great coolant loss during charging and discharging of the magnet coil, and a balanced state of the currents in the bridged coil sections would establish only very slowly after the charging or discharging process. The advantage of elements with sufficiently low resistance values with regard to compensation of magnetic field disturbances can be utilized therefore only when the elements can be connected and disconnected during operation of the magnet configuration as provided in the present invention. The resistive elements could also be provided in an inventive manner as connectable protective resistors with correspondingly higher resistance values (approximately 1 ohm).

| List of Reference Numerals | |
|---|---|
| A1, A2, A3, A4, A5 | Connecting points |
| AV | Working volume |
| G | Counter pole of the plug ST |
| HN | Half notch |
| K1, K2, K3, K4 | Contacts |
| KK | cryogenic chamber |
| M | Magnet coil system |
| P | Superconducting current path |
| $P_{A1-A2}, P_{A2-A3}, P_{A3-A4}$ | Sections |
| R1, R2 | Protective elements |
| S1, S2, S3, S4 | Switch |
| SE1, SE2 | Sections of the magnet coil system |
| SE2L1-14, SE2L15-24 | Coil sections of the section SE2 |
| ST | Plug |
| $W_{A1-A2}, W_{A2-A3}, W_{A3-A4}, W_{A1-A3}$ | Resistive elements |

We claim:

1. A magnet configuration comprising:
   a superconducting magnet coil system;
   a current path which is at least partially superconducting and which includes at least parts of said magnet coil system;
   at least two electric connecting points disposed in said current path to define at least one section within said current path, wherein said section does not comprise all parts of said magnet coil system which are contained in said current path;
   at least one resistive element having a resistance; and
   at least two electric contacts connected in series between said resistive element and one of said at feast two electric connecting points, wherein, in a superconducting state of said magnet coil system, at least one or said two electric contacts comprises a switching or plugging element for connecting and disconnecting said resistive element to and from said section, wherein said at least one resistive element is disposed in a plug device, said resistive element being connected to said connecting points by closing said electric contacts via insertion of said plug device into a mating socket from which said connecting points extend.

2. The magnet configuration of claim 1, wherein said superconducting magnet coil system generates a magnetic field in a direction of a z axis in a working volume disposed about z=0 on the z-axis and said at least two connecting points are disposed in said current path in such a manner that a value $$\beta(t) = 1 + \frac{b \cdot \Delta I(t)}{\Delta B_z}$$

results in $\beta_{closed}(t=0)$ when said at least two electric contacts are closed at a time t=0, whose magnitude is smaller than $\beta_{open}(t=0)$, at time t=0 with said electric contacts open, wherein b is a vector of magnetic fields in a direction of the z axis of each winding of said magnet coil system in the working volume for 1 respective ampere of current, and $\Delta I(t)$ is a vector of current changes of each said winding of said magnet coil system which are induced by a change $\Delta B_z$ in the magnetic field, wherein $\Delta B_z$ is a component parallel to the z-axis of a stepped change in a background magnetic field in a region of the magnet configuration at time t=0.

3. The magnet configuration of claim 2, wherein said at least one resistive element is dimensioned such that, with said at least two electric contacts closed, a value $\beta_{closed}(t)$ is smaller or equal to a value $\beta_{open}(t)$ which results with said electric contacts open, for all times t.

4. The magnet configuration of claim 1, further comprising a cooled chamber within which said at least one resistive element and said superconducting magnet coil system are disposed.

5. The magnet configuration of claim 1, further comprising at least one permanently wired protective element bridging parts of said current path in parallel.

6. The magnet configuration of claim 5, wherein said at least one permanently wired protective element comprises ohmic resistors and/or diodes.

7. The magnet configuration of claim 5, wherein said at least one resistive element has a resistance value, which is smaller than a resistance value of said at least one protective element.

8. The magnet configuration of claim 1, wherein said resistive element is connected to said connecting points by closing said contacts through operation of at least one switch.

9. The magnet configuration of claim 1, wherein said resistive element has a resistance value which increases with increasing current.

10. The magnet configuration of claim 5, wherein said resistive element assumes a high ohmic value in case of a quench of said superconducting magnet coil system, wherein said at least one permanently wired protective element ensures protection of said magnet coil system.

11. The magnet configuration of claim 10, wherein said resistive elements have a resistance value of more than 10 ohms.

12. The magnet configuration of claim 1, wherein said resistive elements are safety elements, which can carry at most 20% of a magnetic current before they burn and assume a high ohmic value.

13. The magnet configuration of claim 12, wherein said high ohmic value is more than 10 ohms.

14. A method for operating the magnet configuration of claim 1, wherein the at least one electric contact between the at least one electric connecting point and the at least one resistive element is closed during operation of the magnet coil system and opened during charging and discharging of the magnet coil system.

* * * * *